(12) United States Patent
Meagley

(10) Patent No.: US 7,615,329 B2
(45) Date of Patent: Nov. 10, 2009

(54) BRANCHING SELF-ASSEMBLING PHOTORESIST WITH DECOMPOSABLE BACKBONE

(75) Inventor: Robert P. Meagley, Emeryville, CA (US)

(73) Assignee: Intel Corporation, Santa Clara, CA (US)

( * ) Notice: Subject to any disclaimer, the term of this patent is extended or adjusted under 35 U.S.C. 154(b) by 299 days.

(21) Appl. No.: 11/366,344

(22) Filed: Mar. 2, 2006

(65) Prior Publication Data

US 2007/0207403 A1   Sep. 6, 2007

(51) Int. Cl.
*G03F 7/004*   (2006.01)
*G03F 7/032*   (2006.01)

(52) U.S. Cl. .................... 430/270.1; 430/908
(58) Field of Classification Search .............. 430/270.1, 430/326, 908
See application file for complete search history.

(56) References Cited

U.S. PATENT DOCUMENTS

| 6,333,141 | B1 * | 12/2001 | Carter et al. ............. 430/314 |
|---|---|---|---|
| 6,455,223 | B1 * | 9/2002 | Hatakeyama et al. .... 430/270.1 |
| 6,541,597 | B2 * | 4/2003 | Okino et al. .............. 528/272 |
| 6,579,463 | B1 * | 6/2003 | Winningham et al. ........ 216/41 |
| 6,872,505 | B1 | 3/2005 | Cao et al. ............... 430/270.1 |
| 7,029,723 | B2 | 4/2006 | Chen et al. .............. 427/249.5 |
| 7,084,060 | B1 * | 8/2006 | Furukawa et al. .......... 438/677 |
| 7,166,413 | B2 * | 1/2007 | Cao et al. ............... 430/270.1 |
| 2003/0129531 | A1 * | 7/2003 | Oberlander et al. ...... 430/271.1 |
| 2003/0224287 | A1 * | 12/2003 | Fujimori ................. 430/270.1 |
| 2004/0086800 | A1 | 5/2004 | Meagley ................. 430/270.1 |
| 2005/0012090 | A1 * | 1/2005 | Gerlach ...................... 257/40 |
| 2005/0106498 | A1 | 5/2005 | Cao et al. ............... 430/270.1 |
| 2006/0046069 | A1 * | 3/2006 | Jung et al. ................. 428/429 |
| 2006/0068318 | A1 | 3/2006 | Meagley et al. .......... 430/270.1 |

FOREIGN PATENT DOCUMENTS

EP   0 252 233   *   1/1988

* cited by examiner

*Primary Examiner*—Cynthia H Kelly
*Assistant Examiner*—Anca Eoff
(74) *Attorney, Agent, or Firm*—Trop, Pruner & Hu, P.C.

(57) ABSTRACT

By using a branched long chained chain scission polymer as a photoresist for high resolution extreme ultraviolet (EUV), e-beam or 193 nanometer lithography applications, a relatively higher molecular weight polymer with good mechanical properties may be achieved. In addition, by using chain scission technology, line edge roughness and resolution may be improved at the same time.

5 Claims, 10 Drawing Sheets

BRANCHING SELF-ASSEMBLING PHOTORESIST WITH DECOMPOSABLE BACKBONE

BACKGROUND

This invention relates generally to the fabrication of integrated circuits and, particularly, to photoresist utilized in the manufacturing of integrated circuits.

A thin photoresist film is patterned and used as a sacrificial layer to transfer the pattern to the underlying substrate during the manufacturing of integrated circuits. Patterns are created in a photoresist film as a result of exposure to radiation through a mask. The radiation causes a chemical reaction that changes the solubility of the photoresist. As a result, upon subsequent exposure to a developer solution, some of the photoresist may remain and other of the photoresist may be removed resulting in the transfer of a pattern from the exposure mask to the semiconductor structure.

This pattern, now resident in the photoresist structure, may in turn be utilized as a mask to remove portions of the underlying semiconductor structure using chemical etching processes. Thus, the use of photoresist enables the repeated fabrication of a large number of integrated circuits using a single mask that repeatedly transfers the same pattern to the semiconductor structure.

It has been the goal for many years in semiconductor fabrication to reduce the size of the features that are fabricated. Smaller integrated circuits generally mean faster integrated circuits and lower cost integrated circuits. One way to reduce the feature size is to use improved lithography. Generally, lithography improvements have been the result of changing the wavelength of the radiation used to expose the pattern. With wavelengths that are able to define even smaller patterns, the photoresist technology will also need to be improved to realize a decreased feature size. Namely, when smaller features may be exposed through improvements in lithography, it is also necessary that the photoresist be able to define the smaller features enabled by improved lithography.

The size of the features that undergo dissolution in the photoresist ultimately limits the line edge roughness (LER) and resolution that is available with any lithographic system. Line edge roughness is the roughness of the edge of the photoresist. This roughness is transferred to the underlying semiconductor structure in the subsequent processing steps, adversely affecting device performance. Thus, many manufacturers of integrated circuits have focused on reducing the molecular weight of the polymers used in photoresist in order to reduce line edge roughness and increase resolution.

Unfortunately, a reduction of molecular weight of these photoresist forming polymers may have a negative impact on the mechanical properties of the photoresist. For example, lower molecular weight photoresists may be more likely to exhibit photoresist pattern collapse. Obviously, when the pattern collapses, the photoresist may be non-functional.

Thus, there is a need for better photoresists that exhibit desirable line edge roughness and improved resolution, without resist photoresist pattern collapse for high resolution lithography with radiation such as extreme ultraviolet (EUV), e-beam or 193 nanometers.

DETAILED DESCRIPTION

Figure 1A:
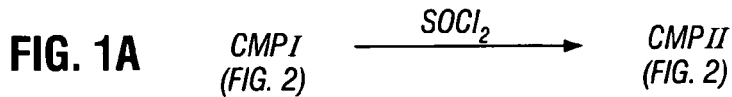
FIG. 1 is a chart showing the synthesis of an alicyclic self-assembling module dendrimer.

Traditionally the difference in the solubility of the exposed and unexposed photoresist in a developer solution occurs when protecting groups are cleaved in the exposed region. Once these groups are cleaved, the solubility of the polymer changes, usually with the cleavage of non-polar side groups from the polymer backbone leaving polar groups in their place that are more soluble and/or reactive in an aqueous base. The entire polymer molecule may then be selectively dissolved in a developer. Another method that is employed is for radiation to effect modification of the polymer by breaking it into smaller pieces that are more soluble. This second approach is called chain scission.

The minimum value possible for resolution and line edge roughness is limited, in part, by the size of the polymer molecules. Furthermore, polymer molecules are known in some cases to associate with each other and/or with small molecule additives present, forming aggregates composed of many molecules that react and dissolve non-uniformly, further limiting resolution and line edge roughness.

Chain scission is the result of the breaking of chemical bonds. A chemical bond is a connection between two atoms in a sequence of atoms in the constitutional units of a macromolecule, an oligomer molecule, a block, or a chain which defines the essential structural representation of a polymer.

In polymers that undergo chain scission, the difference in solubility between the exposed and unexposed regions can be driven either by solubilizing groups (i.e. carboxylic acids) being chemically revealed by the scisson reaction and/or by differences in molecular weight. Because the size of the polymer segments that are dissolving is small, the resolution and line edge roughness are not limited by the size of the original chain scission polymer. Since segments cleaved from polymer after chain scission undergo dissolution rather than the entire polymer, the molecular weight is decoupled from the resolution and line edge roughness.

Therefore, a relatively higher molecular weight polymer may be utilized to improve mechanical properties such as Young's modulus and yield stress. Also, by using branched polymers, better mechanical properties may be achieved in some embodiments. In some embodiments, the molecular weight of the polymer may be greater than 10000 Daltons. The branches may be long chains having sizes greater than 5000 Daltons in some embodiments.

The size of the scissioned polymer segments after exposure may be engineered by changing the number and nature of scissionable linkages in the polymer's backbone. For example, a chain scission polymer may include a polymer backbone with branches extending therefrom. Chain scission points may be defined along the length of the branches, which chain scission points may be subject to a chain scission reaction.

Due to the large molecular weights that can be used with chain scission polymers, the mechanical properties of branched chain scission photoresist may be improved. The size of the polymer molecule is decoupled from its imaging properties. Long branches may be incorporated into the polymer. These modifications of branch length and molecular weight improve the mechanical properties of the photoresist and reduce the severity of any photoresist collapse.

The synthesis for a scissionable branched nobornyl star polymer is shown in FIG. 1. In the resulting star polymer, each repeat unit within the polymer can undergo scission.

Figure 2:
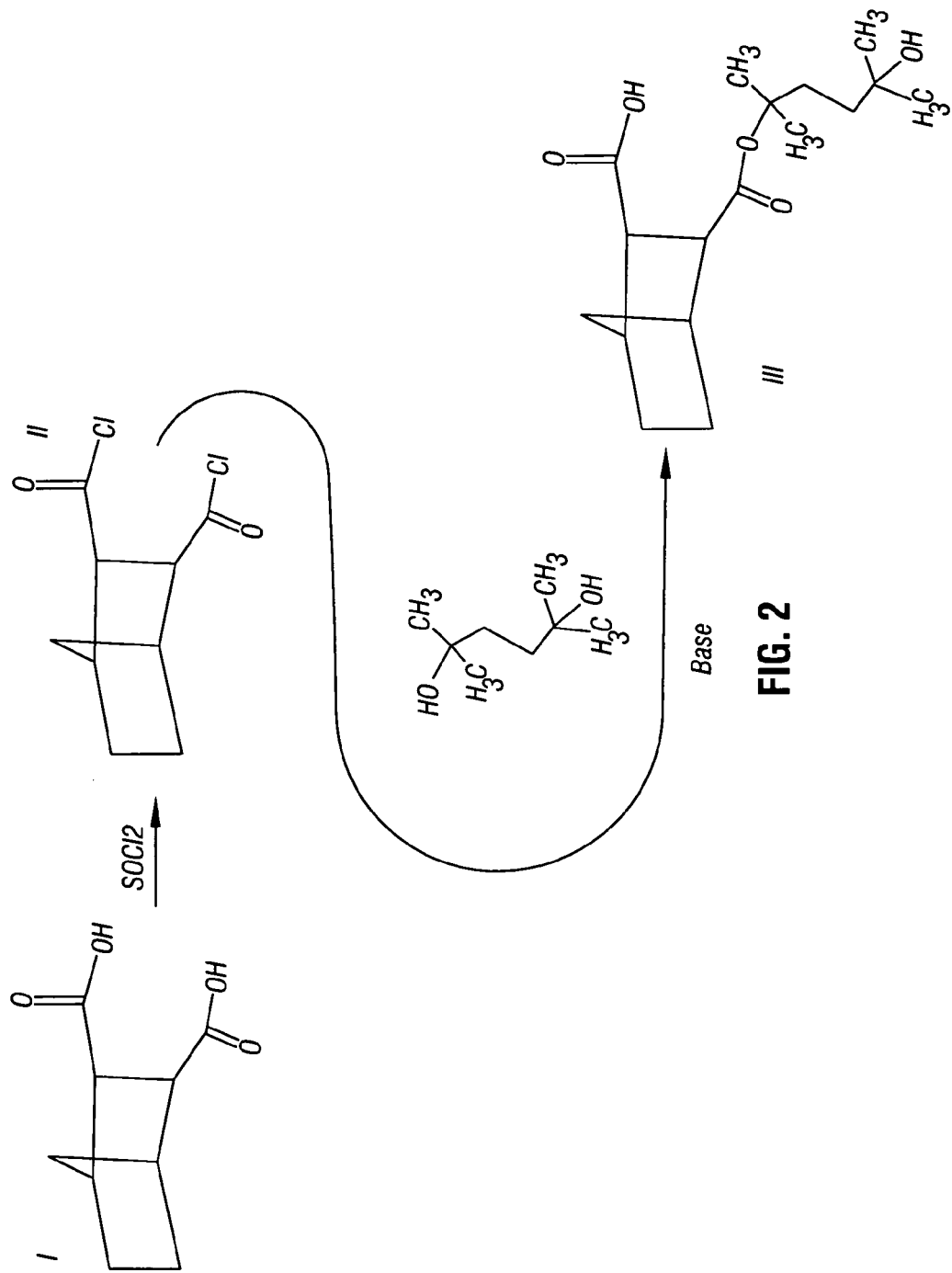
FIG. 2 is a depiction of the conversion from compound I to compound II to compound III.

Compound I, indicated in FIG. 1A, is a norborane dicarboxylic acid shown in FIG. 2. Compound I is reacted with $SOCl_2$ to form the compound II, which is a norborane dicarbonyl dichloride, as indicated in FIG. 1A. $SOCl_2$ activates the monomer by turning acid groups into an acid chlorides which subsequently react with alcohol groups to form esters.

Alternatives to $SOCl_2$ include PBr3, CCl4/PPh3, and trifluoroacetic anhydride (TFAA). The reaction may be assisted by boiling. Other alternatives include using pyridene, a mixture of pyridene and toluene, or pyridene and dichloromethane to form the ester. When using pyridene, $SOCl_2$ may be added to pyridene at a temperature less than 0° C., allowed to set for 30 minutes, and then reacted with compound I to get compound II.

Figure 1B:
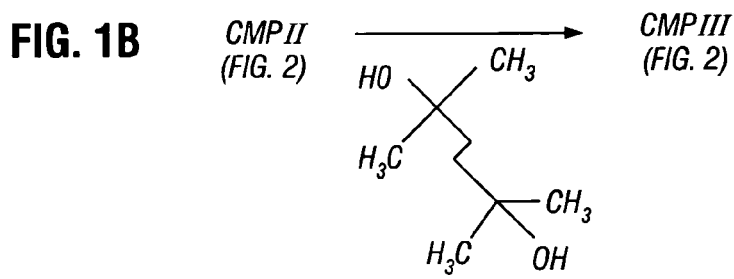

The compound II, shown in FIG. 2, in turn, is reacted with 2,5-dimethyl-2,5-hexanediol in a basic solution to form the intermediate compound III, as indicated in FIG. 1B. Suitable bases, for activating the diol, may include methyl lithium (MeLi), diazabicyclooctane (DABCO), sodium hexamethyl disilazide (NaHMDS), lithium diisopropylamide (LDA), or triethylamine (Et3N). The reaction may proceed at a temperature below 0° C. The intermediate compound III, shown in FIG. 2, may link further.

Figure 1C:
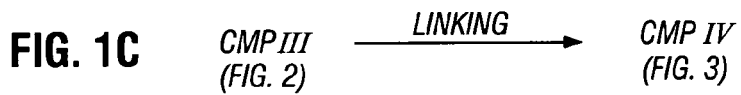
Figure 3:
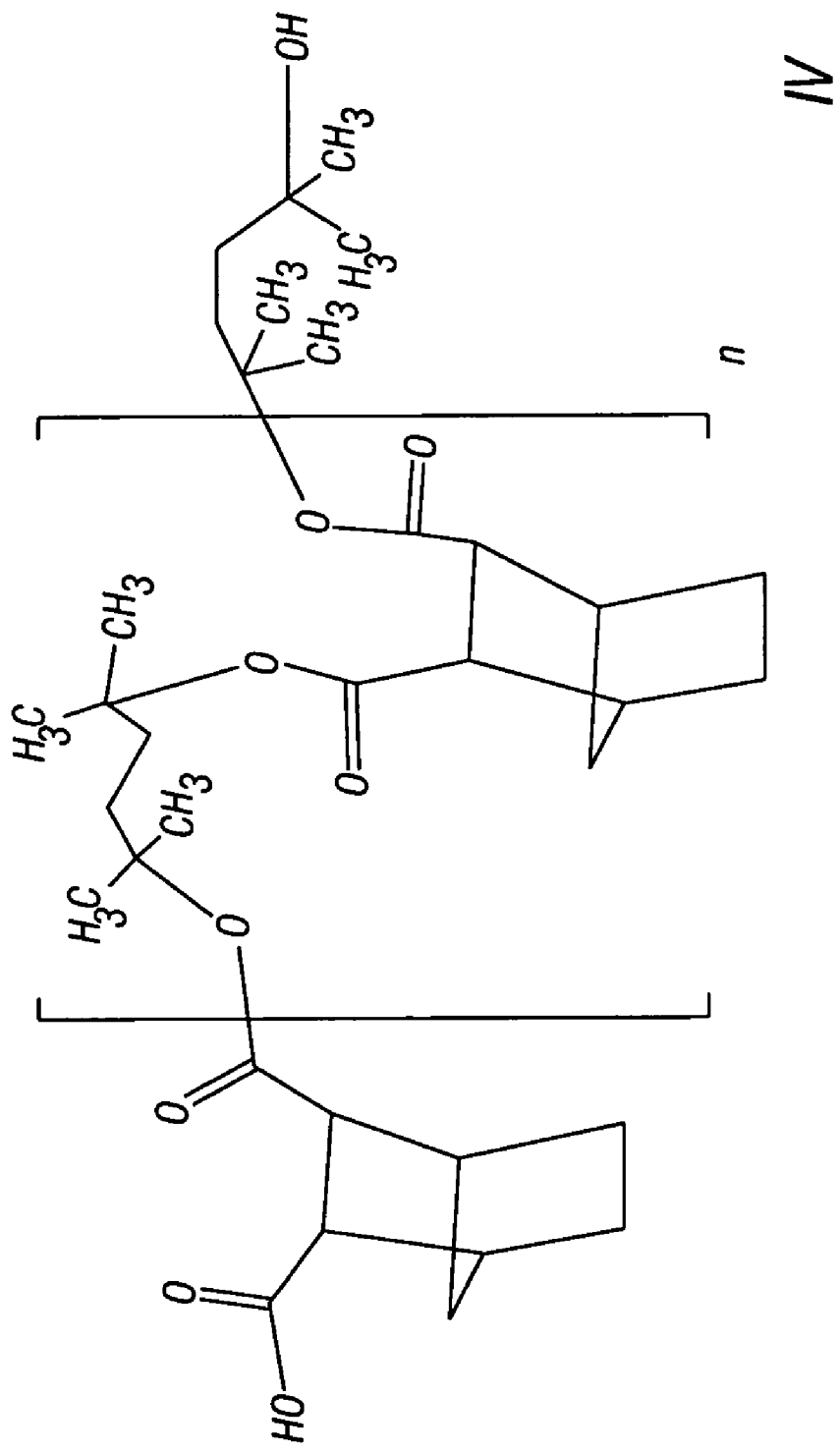
FIG. 3 is a depiction of compound IV in accordance with one embodiment of the present invention.

Further linking of intermediate compound III with itself, as indicated in FIG. 1C, forms the compound IV. Compound IV is a polynorboranediester. Units of compound III may then be linked together to form linear structures including compound IV, as shown in FIG. 3.

Figure 1D:
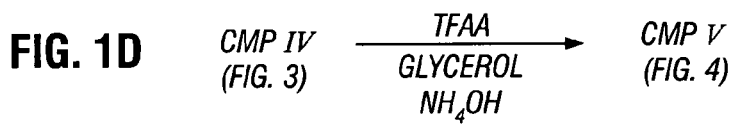

Next, the compound IV (FIG. 3) is reacted to form the compound V (FIG. 4), as indicated in FIG. 1D. The compound IV may be reacted with trifluoroaceticanhydride (TFAA), glycerol and $NH_4OH$ in sequence to form branched structures including compound V, which is a scissionable branched polynorbornyldiester star, shown in FIG. 4.

Figure 4:
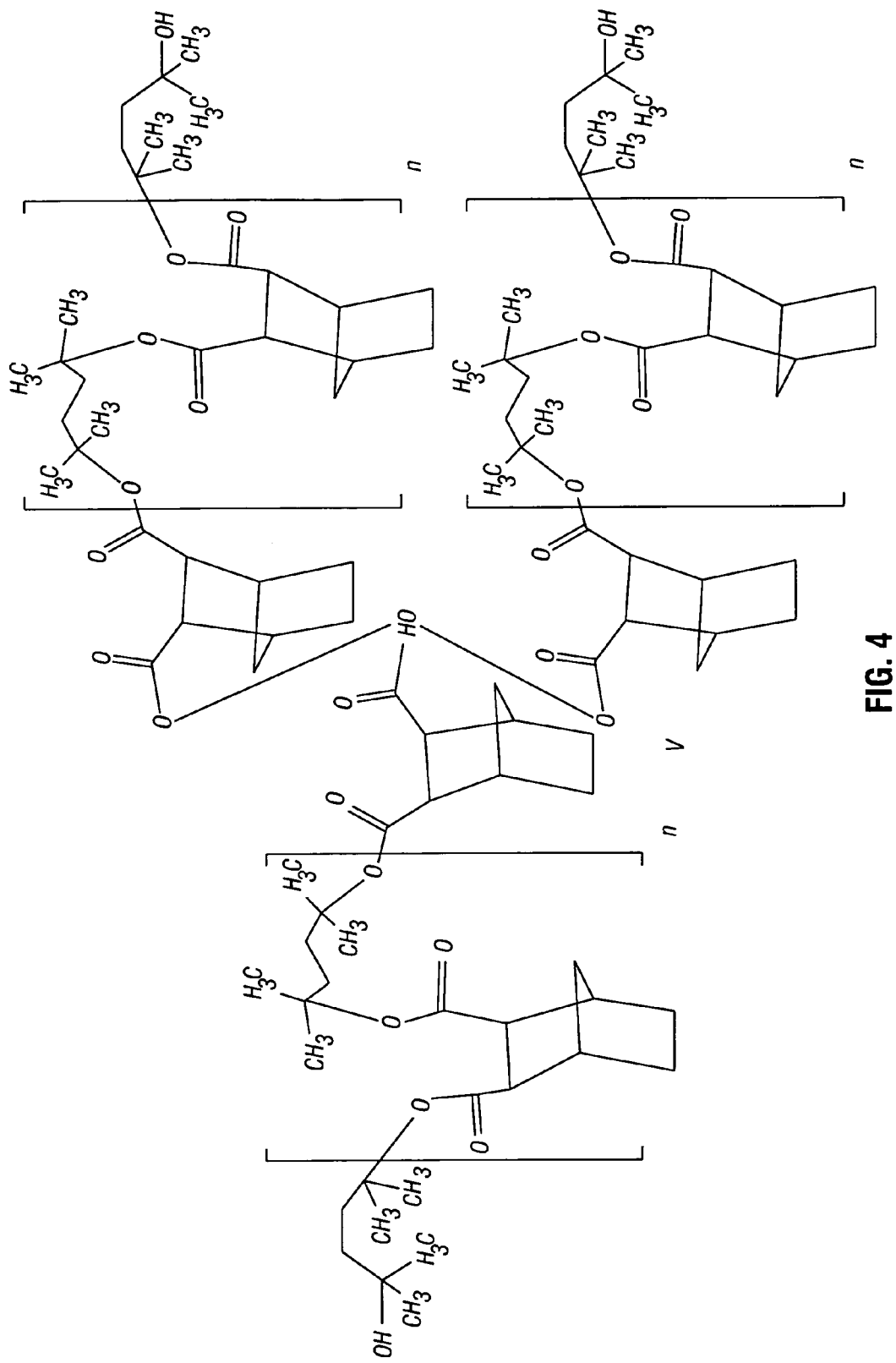
FIG. 4 is a depiction of compound V in accordance with one embodiment of the present invention.

Structures exemplified by compound V, shown in FIG. 4, may be scissionable branched acid decomposable backbone polymers, such as polytertiary esters, including scissionable branched polynorbornyldiester polymers. These can be decomposed (scissioned) by acid catalysis to a variety of degradation products comprising smaller fragments of the structure shown in FIG. 3, monomeric norbornanedicarboxylate, 2,5-dimethyl-1,5-hexadiene and glyceryl norbornanedicarboxylates.

Figure 1E:

Finally, the compound V is reacted with trimethoxysilane (TMOS)-carboxylate, to form structures including the compound VI (FIG. 6), as indicated in FIG. 1E.

The monomers of the symmetric and pseudo-symmetric polymer are linked by modular assembly using mild conditions. In the example synthesis of TMOS carboxylate, shown in FIG. 5, trifluoroacetic anhydride (TFAA) forms mixed anhydride with carboxylic acid functionality on the growing molecule which is displaced by the alcohol moiety of the new building block (compound V) making the tertiary ester, shown in FIG. 6, with good yield.

Figure 5:
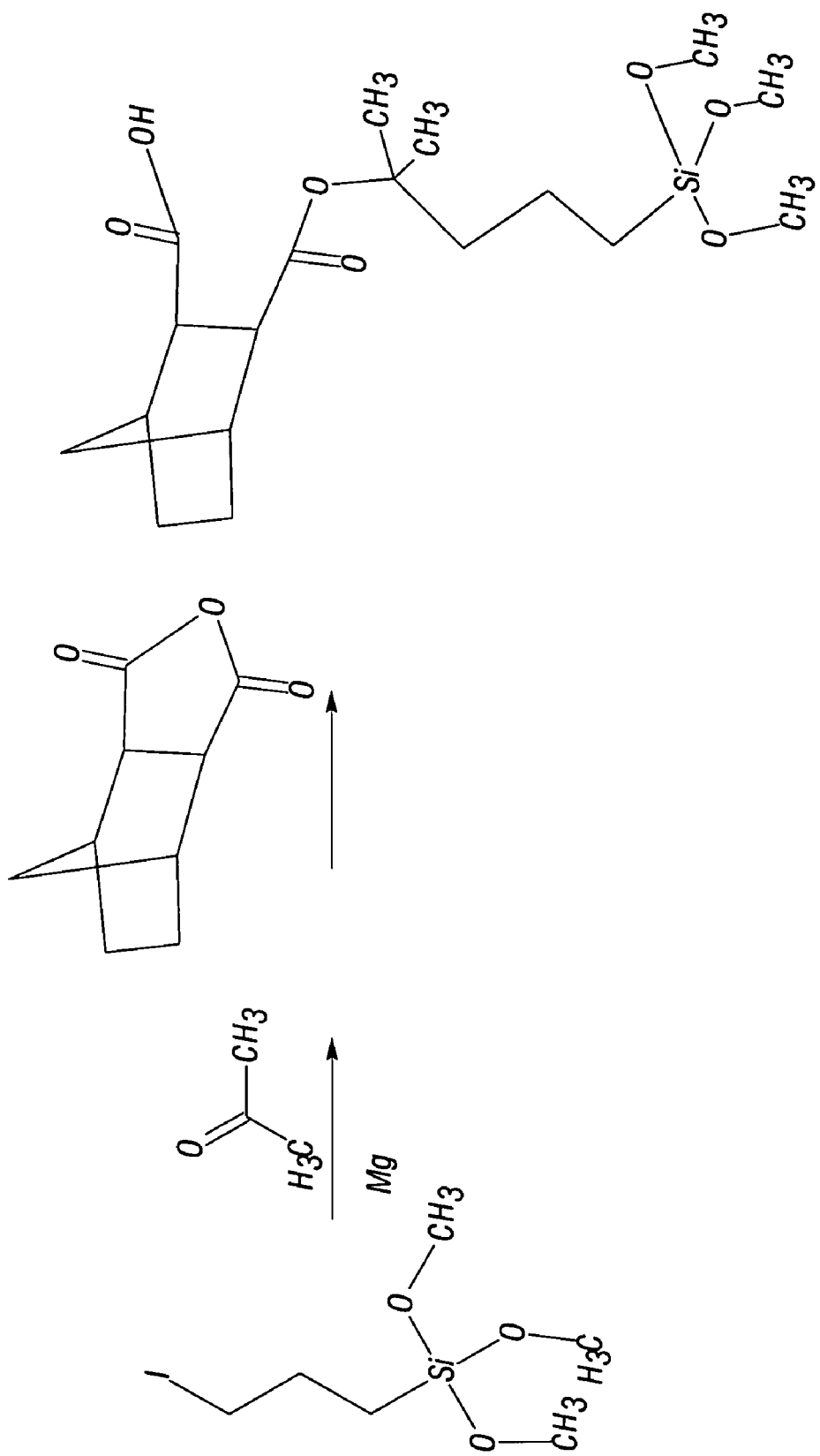
FIG. 5 is a depiction of the formation of a material which is used to form the compound VI.

A linker alcohol is formed from 3-iodopropyl-trimethoxysilane (shown on the left in FIG. 5) in a Barbier reaction with a ketone, such as acetone, and magnesium to give the tertiary alkoxide as shown at the middle compound in FIG. 5. This reaction may be facilitated through the application of ultrasound to improve reation efficiency. An alternative to magnesium is lithium. Another alternative is to employ a copper complex, for example by using copper bromide-dimethylsulfide complex with either the magnesium or the lithium reaction. The copper complexes may be used below −20 degrees. Once formed, the tertiary alkoxide is treated with the norbornanedianhydride to form a carboxylate (depicted as the right most structure in FIG. 5). The carboxylate of FIG. 5 is activated for coupling as described above, for example with TFAA, forming an intermediate mixed anhydride. Scissionable branched polynorbornyldiester polymers (compound V) and then $NH_4OH$. Suitable solvents include dichloromethane, toluene, ether, tetrahydrofuran, and dimethoxyethane. The reaction may be done at a temperature below 0° C. The alcohol of structure IV binds to the activated linker, forming a tertiary ester by reaction with the mixed anhydride thus formed from TFAA. Alternative construction may be accomplished linking the ester via a dicyclohexylcarbodiimide (DCC) coupling as described above. More complex linker construction strategies may be envisioned to circumvent synthetic difficulties for particular structures. For example, the catalytically sensitive linkage to the self-assembling group may be mediated by a bridging moiety.

Figure 6:
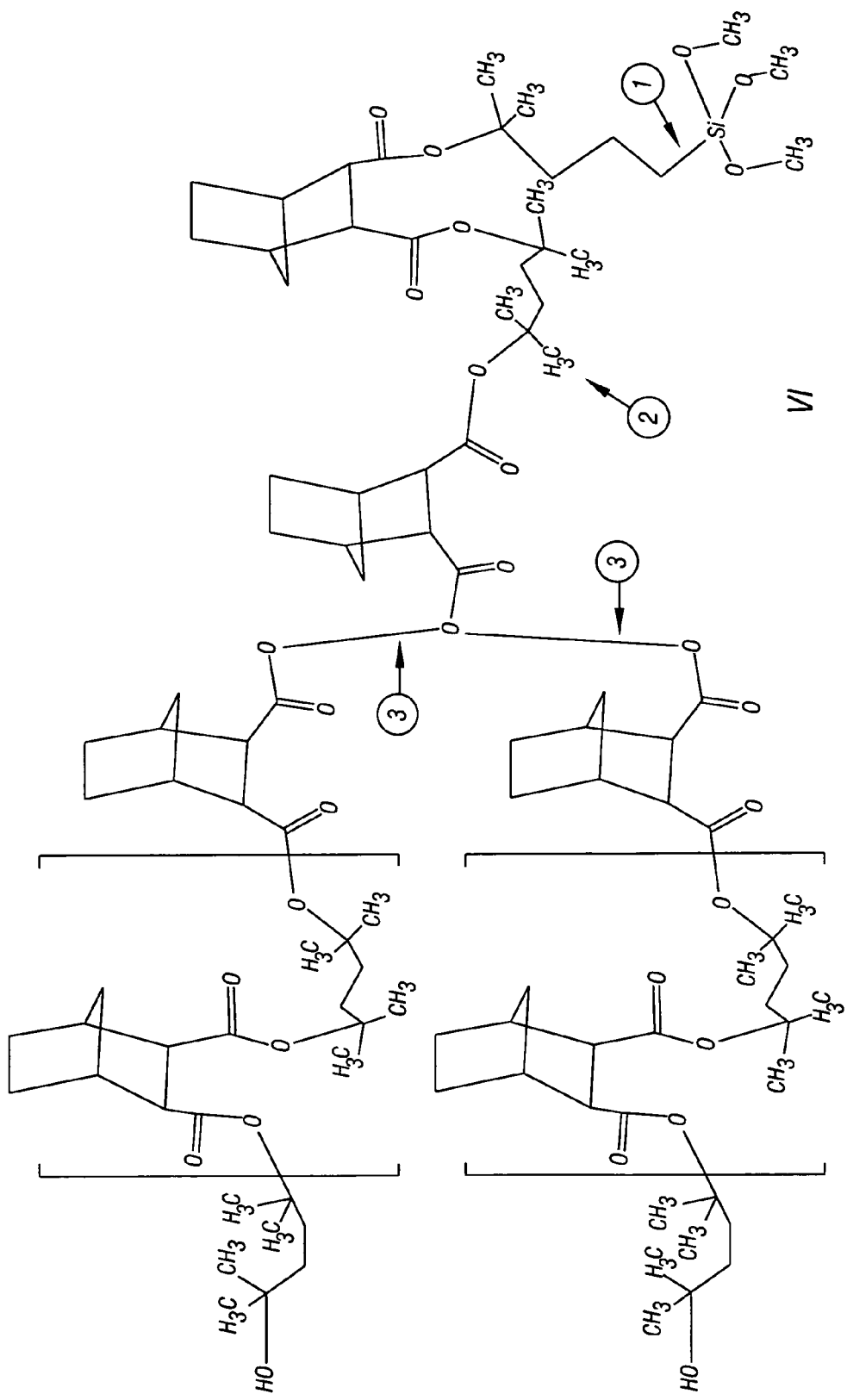
FIG. 6 is a depiction of compound VI which is the dendrimer.

The products, including compound VI, shown in FIG. 6, are in general alicyclic self-assembled monolayer (SAM) branched polymers. Compound VI, shown in FIG. 6 is an example of an alicyclic self-assembled monolayer (SAM) dendrimer. A dendrimer is a synthetic, three-dimensional polymer macromolecule formed using a chemical nanoscale fabrication process and built up from monomers, with new branches added in a tree like structure. Related structures to compound VI are hyperbranched polymers. A hyperbranched polymer is another type of polymer macromolecule having a highly three dimensional structure somewhat less organized than dendrimers, fabricated in a less controlled fashion than dendrimers using analogous chemical nanoscale fabrication techniques.

In some embodiments of the present invention, the macromolecule, depicted by FIG. 6, is a symmetric, dendrimeric module with high carbon content. The high carbon content provides good etch resistance and a low Ohnishi parameter through the use of steroids, alicyclics, and aromatics, as well as clusters of atoms. In some embodiments, aromatics and atomic cluster-based systems may be envisioned as hybrids.

The reaction to form the compound VI may use one third of the TMOS-carboxylate to one of the branched norbornyl star (compound V) to reduce the number of functionalized legs.

Thus, by selection of reaction conditions and sequence, a symmetric or pseudo-symmetric structure with C2V symmetry may be formed with one surface binding group to direct self-assembly. Analogous syntheses may be contemplated, employing other SAM motifs, including thiols, phosphates, diazos, etc., as well as other silanes, silazides and siloxanes. Additional schemes may be used that make use of more than one binding group.

The photoresist may be formed of dendrimers formed from dendrons such as those described in FIG. 6. In such case, instead of a linker to self-assembling moiety, the linker connects several dendrons to form a symmetrical/pseudo-symmetrical structure.

The example shown in the FIG. 4 illustrates different numbers of scissionable linkages and branching configurations that are possible within a chain scission polymer. The scissionable linkages may also be distributed at strategic intervals within the polymer. As well, the ratio of branched to straight chain polymer may be varied to meet specific lithographic requirements.

In some embodiments, compound V, shown in FIG. 4, may be used as a photoresist by itself.

Figure 7:
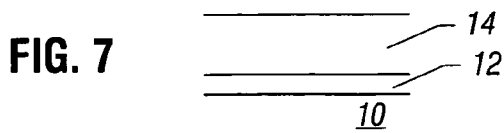
FIG. 7 is an enlarged, partial cross-section of a photoresist on a substrate.

As another alternative, a semiconductor wafer 10 may be treated with the compound VI of FIG. 6 which is a self-assembled monolayer to form layer 12, as shown in FIG. 7.

The self-assembled monolayer acts as a glue to secure an over layer 14 of compound V from FIG. 4. The self-assembled monolayer 12 adheres well to the substrate and to the compound V layer 14 as well. There is also improved dissolution of both the layer 14 and the under layer 12. The layer 12 gives chemical amplification, as well as adhesion, and can be used to aid in the dissolution of the covering layers 12 and 14. As a result, in some embodiments, improved contrast and resolution may be achieved for the over layer 14 as well.

In practice, the compound VI, of FIG. 6, will have the silicon atom pointing downwardly. When the photoacid generator is added, it can clip off the polymer, leaving the silicon atom attached to the underlying wafer. For example, the clip or scission may occur at the point 1 in FIG. 6. This is generally sufficient to achieve imaging. However, in some embodiments, there may be two additional modes of scission. Scission can occur along the branch in the region indicated by the arrow 2 in FIG. 6. Scission may also occur at either of the locations 3 in FIG. 6, removing one or the other of the branches.

In some embodiments, the scission activity may be tuned through the use of tailored chemistry. In other words, the chemistry may be selected to preferentially result in scission at one of the locations 1, 2, or 3 in FIG. 6.

Another example of a dendrimer made of scissionable subunits and the incorporation of such dendrimers into self-assemblying modules includes the use of steroid monomers. In one embodiment, a scissionable dendrimeric polyester made of steroids made by synthesized. This scissionable dendrimeric polyester may be formed as follows.

Figure 8:
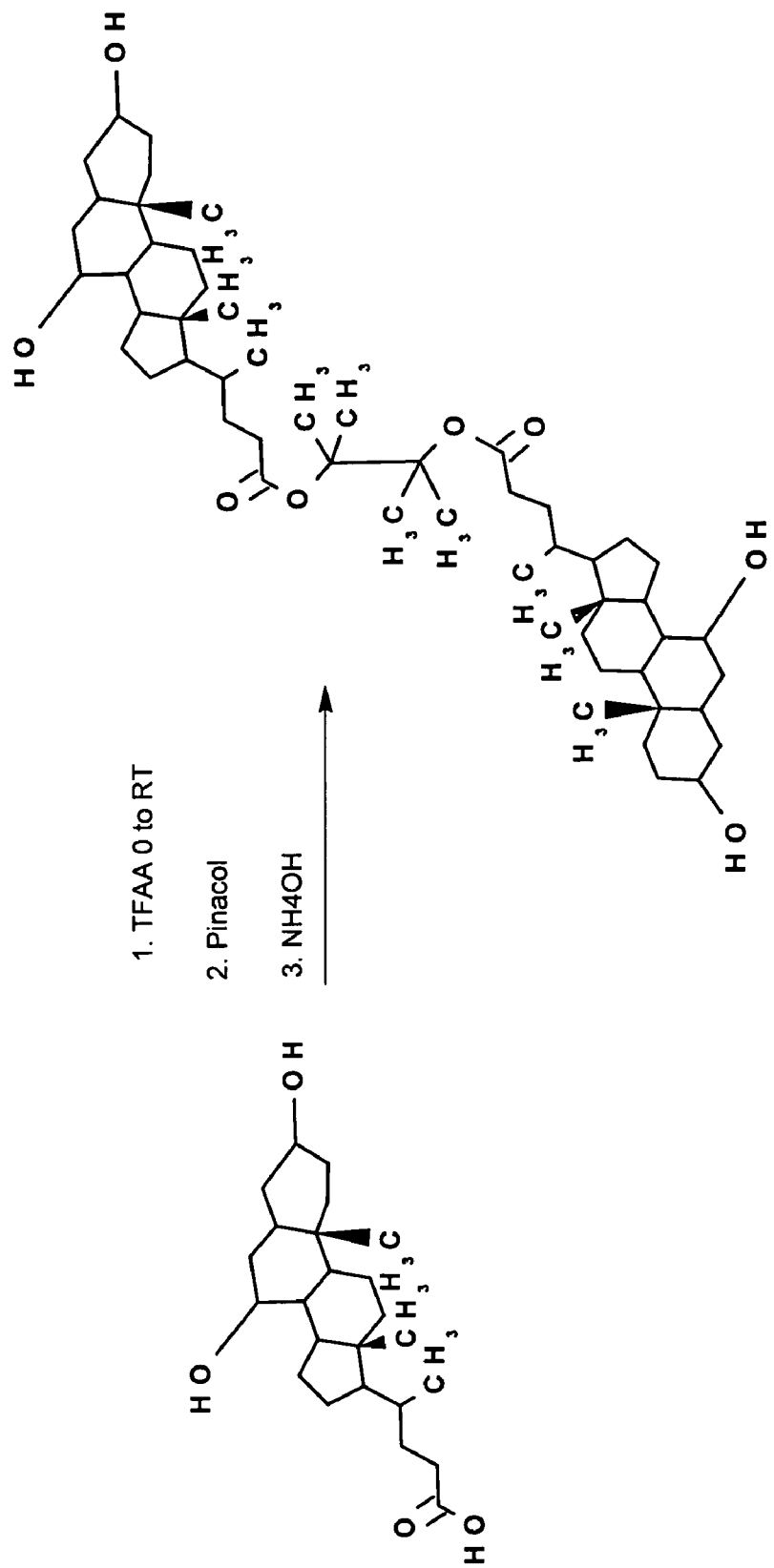
FIG. 8 is a depiction of the synthesis of a self-assembly monomer using a steroid.

As shown in FIG. 8, deoxycholic acid may be reacted with a pinacol ABA trimer ("Rigid Deoxycholate" dimer). In one embodiment, 1 g deoxycholic acid (392.6 g/mol, 2.55 mmols) is diluted in 5 ml. dry (sieves) tetrahydrofuran (THF), chilled to a temperature of lower than 0° C., treated with 1 ml trifluoroacetic anhydride (TFAA, 210 g/mol, d=1.5, 7.1 mmols, 2¾ eq), and stirred at a temperature below 0° C. for 15 minutes, then warmed to 30 degrees (using a heat gun) for 2 minutes and stirred at room temperature for about 20 minutes.

The resulting material is evaporated under N2 stream to about 3 ml. to remove excess TFAA as well as THF and trifluoroacetic acid (TFA) byproduct and then cooled below 0° C. and treated with a second portion 2 ml of TFAA (21.4 mmol ttl added TFAA, 2.8 eq TTL with respect to replaceable OH groups) at room temperature, heated to very brief reflux and stirred for 40 minutes, then again evaporated under N2 stream to about 3 ml. to remove excess TFAA, THF and TFA. This is then cooled to below 0° C. and treated with 0.76 ml THF solution of pinacol (1.7M, 118 g/mol, 1.3 mmol, 0.5 eq).

The resulting reaction mixture is stirred for 2 hours, and then treated with 20 ml concentrated NH4OH solution and 10 ml. toluene, 5 ml. ethyl acetate (EtOAc) and 3 ml isopropanol (iPrOH) to get the liquid needed. The layers are separated, the aqueous liquid is extracted again with 3 ml. toluene and the combined organic layers are concentrated to clear white oil with the odor of toluene. iPrOH (2×2 ml) is added and evaporated to remove toluene traces, and 20 ml 50% aqueous iPrOH is added to get cloudy liquid which is chilled and evaporated simultaneously under N2, which is then decanted to give a glassy solid. This is dried to 0.82749 g, and a second crop is similarly isolated and dried to 0.19043 g (93% yield). A third crop is isolated after adding 1 ml H2O to the liquid remaining. This is dried to 93.7 mg (8.5% 3$^{rd}$ crop, 100% y ttl). Crop one may be diluted in 20 ml. propylene glycol monomethyl ether (PGME) and treated with 83 mg tps nonflate. The resulting material was imaged by extreme ultraviolet (130 90 PAB, 130 120 110 PEB).

Larger dendrimeric materials made from steroids may be elaborated from the structure described above in the following manner.

The alcohol groups in the product shown in FIG. 8 are oxidized to become ketones via a Swern oxidation using dimethyl sulfoxide (DMSO) and oxallyl chloride. Alternatively, trifluoroacetic anhydride may be used in place of the oxallyl chloride, or oxidation with pyridium chlorochromate (PCC) may be used instead of the Swern procedure.

Figure 9:
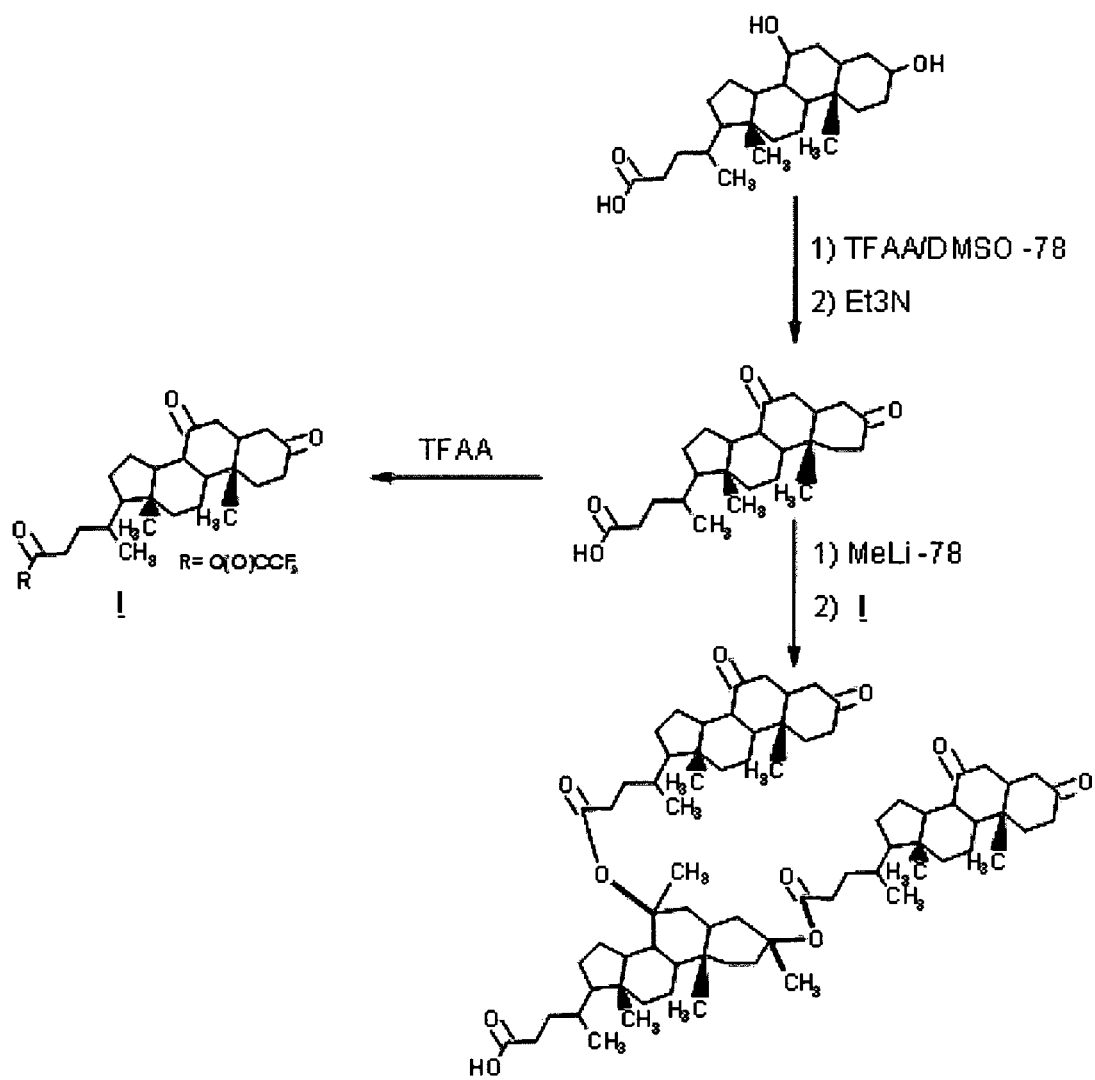
FIG. 9 is a depiction of the synthesis of a self assembling photoresist.
Figure 10:
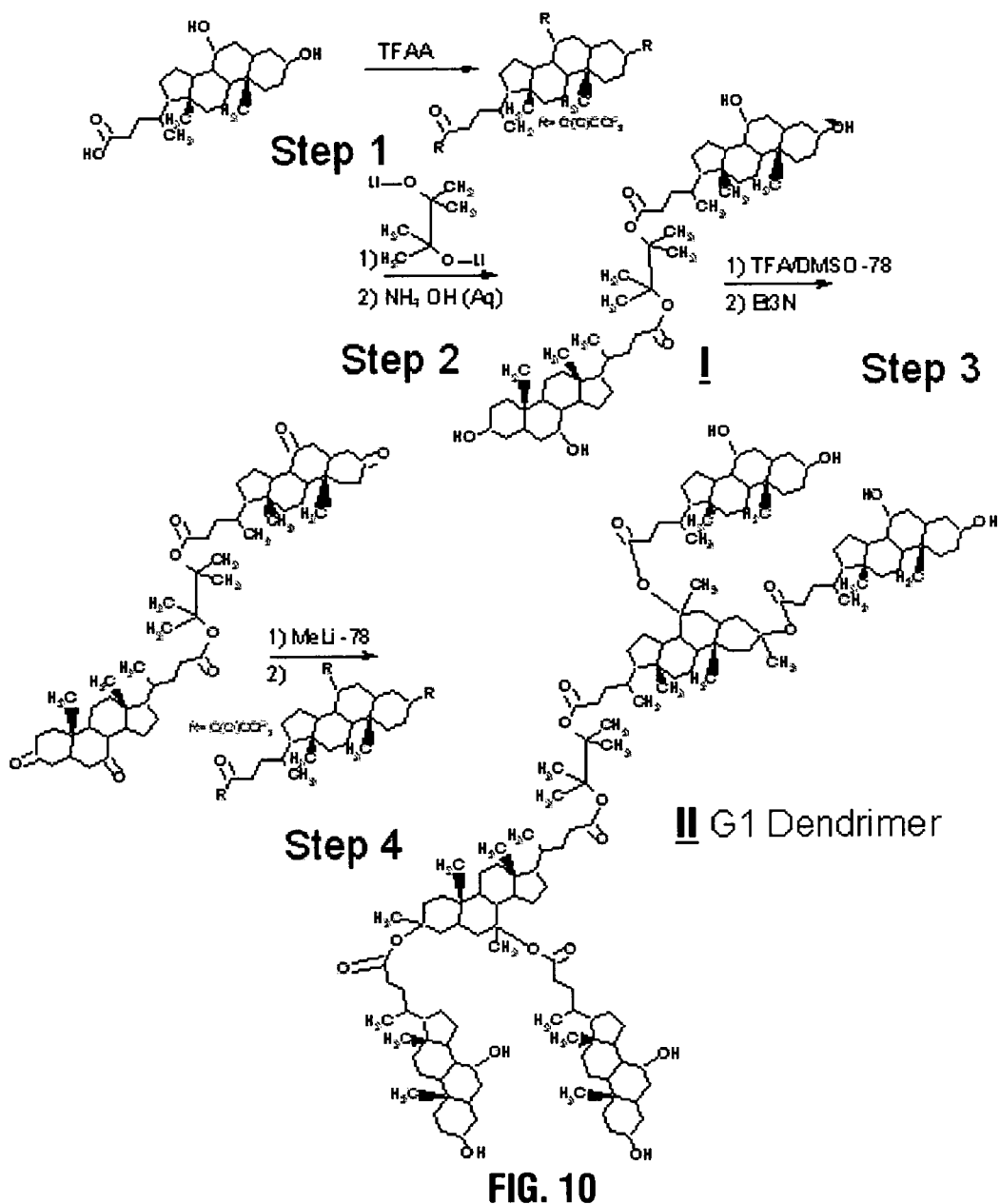
FIG. 10 is a depiction of a dendron according to one embodiment.

The resulting product is then methylated using methyl lithium at less than zero, Celsuis. This may be done in diethyl ether, THF, or toluene and may employ methyl magnesium instead of methyl lithium. The resulting dendrimer, depicted in FIG. 9, now bearing tertiary alcohol groups, may be treated with the mixed anhydride formed from deoxycholic acid and trifluoroacetic anhydride as described above to yield a dendrimer, enlarged by one complete layer of steroidal moieties, as shown in FIG. 10.

A variation on this reaction sequence may be employed to make a self-assembling steroidal dendrimeric resist. For example, the alcohol groups of deoxycholic acid may be oxidized to ketones. This is described above in the synthesis of the dendrimer of FIG. 8 (i.e., Swern oxidation, PCC, etc.). This compound may then be methylated, again as above (methyl lithium, methyl magnesium, etc.). This may then be treated with the mixed anhydride formed form deoxycholic acid and trifluoroacetic anhydride (see FIG. 1E). The product ester is a dendron, enlarged by one layer of steroidal moieties, as shown in FIG. 10. This carboxylate may then be substituted for the compound in FIG. 4 in the reaction sequence depicted in FIG. 1E to make a self assembling steroidal dendrimeric resist analogous to the compound depicted in FIG. 6.

Figure 11:
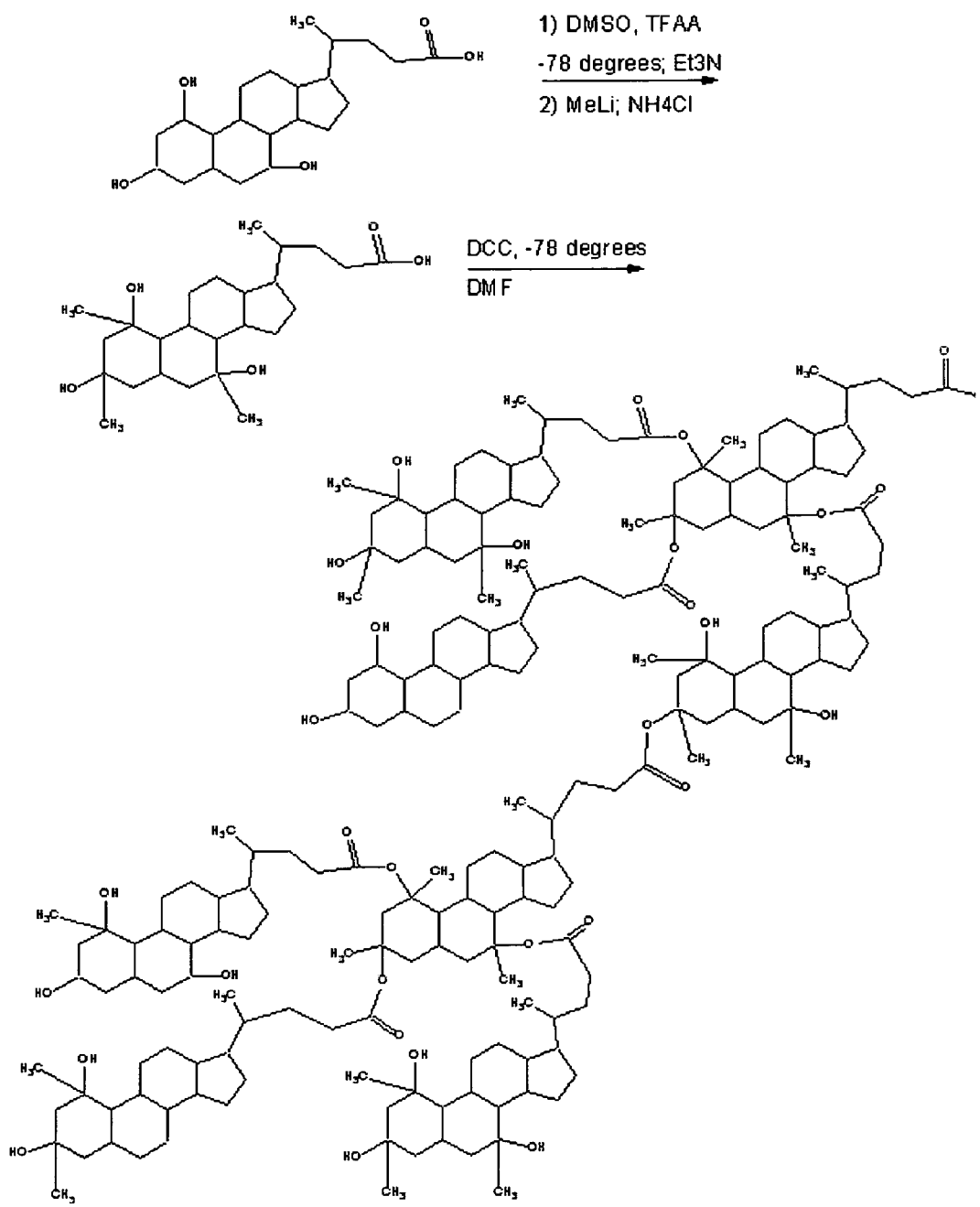
FIG. 11 is a depiction of a hyperbranched structure according to one embodiment.

A hyperbranched material may also be prepared. An example of this is as follows. Deoxycholic acid is oxidized and methylated as above (Swern, methyl lithium) to form a steroidal tertiary polyol-carboxylic acid. This AAAB monomer is then treated the N,N'-dicyclohexyl-cabodiimide (DCC) to effect teriary ester coupling to form the hyperbranched structure of FIG. 11.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A semiconductor structure comprising:
    a substrate; and
    a dendrimer layer on said substrate formed of scissionable units, wherein said dendrimer includes trimethoxysilane.

2. The structure of claim 1 including a branched polynorbonyldiester polymer over said dendrimer.

3. The structure of claim 1 including a branched polysteroidal polymer over said dendrimer.

4. A photoresist comprising:
    a hyperbranched structure including both scissionable units and a steroidal polyol-carboxylic acid.

5. The photoresist of claim 4 including tertiary ester coupling to the hyperbranched structure.

* * * * *

UNITED STATES PATENT AND TRADEMARK OFFICE
CERTIFICATE OF CORRECTION

PATENT NO.      : 7,615,329 B2                                                   Page 1 of 1
APPLICATION NO. : 11/366344
DATED           : November 10, 2009
INVENTOR(S)     : Robert P. Meagley It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 552 days.

Signed and Sealed this

Nineteenth Day of October, 2010

David J. Kappos
*Director of the United States Patent and Trademark Office*